United States Patent [19]

Kawai et al.

[11] Patent Number: 4,935,701
[45] Date of Patent: Jun. 19, 1990

[54] PHASE SHIFT CIRCUIT

[75] Inventors: Masaaki Kawai, Kawasaki; Hisako Watanabe, Machida; Tomoyuki Ohtsuka, Kawasaki; Haruo Yamashita, Yokohama, all of Japan

[73] Assignee: Fujitsu Limited, Kawasaki, Japan

[21] Appl. No.: 246,088

[22] Filed: Sep. 19, 1988

[30] Foreign Application Priority Data

Sep. 19, 1987 [JP] Japan .............................. 62-233665
Dec. 24, 1987 [JP] Japan .............................. 62-333870

[51] Int. Cl.[5] .......................... H03K 5/13; H03K 5/22
[52] U.S. Cl. ...................................... 328/155; 328/55; 328/109; 307/262; 307/511
[58] Field of Search ............... 328/155, 55, 109, 24; 307/262, 511, 479

[56] References Cited

U.S. PATENT DOCUMENTS

| 4,052,679 | 10/1977 | Hosoya | 328/155 |
| 4,297,641 | 10/1981 | Sterzer | 328/155 |
| 4,395,687 | 7/1983 | Belohoubek | 328/155 |
| 4,709,170 | 11/1987 | Li | 307/479 |
| 4,739,279 | 4/1988 | Pion | 328/155 |

OTHER PUBLICATIONS

Charles R. Hogge, "A Self Correcting Clock Recovery Circuit", pp. 1312–1314, Journal of Lightwave Technology, vol. LT-3, No. 6, Dec. 1985.

Primary Examiner—Stanley D. Miller
Assistant Examiner—Richard Roseen
Attorney, Agent, or Firm—Staas & Halsey

[57] ABSTRACT

A phase shift circuit used in a regenerating repeater, includes a separating unit for separating an input signal into two separate signals having a phase difference of a phase angle of 90° therebetween, one separated signal having a "0" phase and the other separated signal having a "$\pi/2$" phase. A distributing unit distributes the "0" phase separated signal and "$\pi/2$" phase separated signal as three distributed signals having phase difference of phase angles of 90° and 180° therebetween, one distributed signal having a "0" phase and the others being a "$\pi/2$" phase distributed signal and a "$\pi$" phase distributed signal. A weighting/compounding unit analyzes the "0" phase distributed signal, "$\pi/2$" phase distributed signal, and "$\pi$" phase distributed signal regarding a plurality of phase signals each having a phase shift extent, compounds each of the phase signals after being weighted by each amplitude, the weighting being performed by a weight control signal applied from an external stage, and generates an output signal adding a phase shift proportional to the weight to the input signal.

18 Claims, 17 Drawing Sheets $$a\cos\theta + b\sin\theta = \sqrt{a^2 + b^2}\cos(\theta - \phi)$$
$$\phi = \tan^{-1}\left(\frac{b}{a}\right)$$

4,935,701

PHASE SHIFT CIRCUIT

BACKGROUND OF THE INVENTION

1. Field of the Invention

The present invention relates to a phase shift circuit, more particularly, it relates to a phase shift circuit enabling an arbitrary phase shift of an input signal of from 0° to 360°, to obtain a phase-shifted output signal.

The phase shift circuit according to the present invention is constituted by a plurality of semiconductor elements. The present invention does not utilize filters consisting of variable L, C, R elements. Thus, it is possible to easily and arbitrarily realize a phase shift of the input signal in a wide band and high frequency area.

2. Description of the Related Art

Various types of phase shift circuits for shifting the phase of the input signal to an arbitrary phase are widely used in the electronics field. Two well-known types of phase shift circuits are an LCRcircuit using inductors, capacitors and resistors by which the desired phase is obtained by adjusting the inductance, capacitance, and resistance, and a delay line by which the desired phase is obtained by adjusting the length thereof.

Almost all phase shift circuits are directed to an input signal having a relatively low frequency area, for example, under several tens of megahertz (MHz), and very few phase shift circuits are directed to an input signal having a high frequency area, for example, several hundreds of MHz, and enabling a phase shift of the input signal of from 0° to 360°.

SUMMARY OF THE INVENTION

The object of the present invention is to provide a phase shift circuit enabling a phase shift of from 0° to 360° of an input having a relatively high frequency, using a plurality of semiconductor elements.

In accordance with the present invention, there is provided a phase shift circuit used in a regenerating repeater, Comprising; a separating unit for separating an input signal into two separate signals having a phase difference of a phase angle of 90° therebetween, one separated signal having a "0" phase and the other separated signal having a "π/2" phase; a distributing unit for distributing the "0" phase separated signal and "π/2" phase separated signal as three distributed signals having phase differences of phase angles of 90° to 180° therebetween, one distributed signal having a "0" phase and the other two distributed signals having a "π/2" phase and a "π" phase, respectively; and a weighting-/compounding unit for analyzing the "0" phase distributed signal, "π/2" phase distributed signal and "π" phase distributed signal regarding a plurality of phase signals each having a phase shift extent, for compounding each phase signal after the signals are weighted by an amplitude, the weighing being performed by a weight control signal applied from an external stage, and for generating an output signal adding a phase shift proportional to that weight to the input signal.

DESCRIPTION OF THE PREFERRED EMBODIMENTS

Before describing the preferred embodiments, an explanation will be given of a conventional phase shift circuit.

Figure 1:
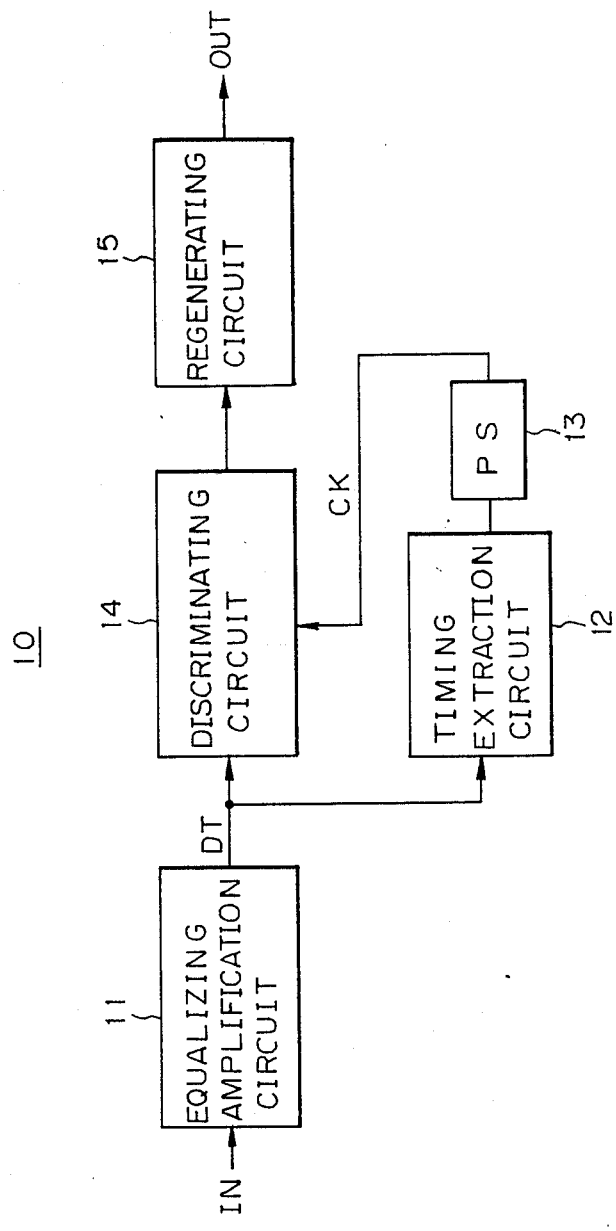
FIG. 1 is a schematic block diagram of a regenerating repeater provided midway in a transmission line.

FIG. 1 is a schematic block diagram of a regenerating repeater provided midway in a transmission line and which mainly carries out a correction of the distortion of the waveform and amplification of the attenuated signal.

In FIG. 1, 11 denotes an equalizing amplification circuit, 12 a timing extraction circuit, 13 a phase adjusting means, 14 a discriminating circuit, and 15 a regenerating circuit.

The equalizing amplification circuit 11 is provided for compensating the attenuation of an input signal IN and the delay of the propagation time at each frequency, and outputting a compensated signal DT. The timing extraction circuit 12 extracts a clock signal CK based on the signal DT and outputs the clock signal CK to the discriminating circuit 14 through the phase adjusting means 13. The discriminating circuit 14 detects a high level "1" and a low level "0" of the signal DT based on a predetermined threshold level to eliminate noise in the signal DT. The regenerating circuit 15 regenerates the input signal based on the discriminating signal "1" and "0", and outputs an output signal OUT to the transmission line.

In the discriminating circuit 14, when the sampling of the signal DT is performed by the clock signal CK, the sampling is performed in the vicinity of the central portion of each signal DT, to eliminate noise, and the signal DT is discriminating at every one bit of the clock signal CK. This sampling can be precisely performed when the speed of the signal DT is relatively low, but sometimes, this sampling fails when the speed of the signal DT is very high because of a narrow pulse width of each bit and jitter of the signal DT.

For example, when the transmission line is an optical fiber, the speed of the signal DT is several hundred megabits per second (Mb/s). In this case, it is necessary that the phase of the signal DT must be precisely synchronized with that of the clock signal CK at the vicinity of the central portion of the signal DT in the regenerating circuit 15. Therefore, the shift angle of the clock signal CK must be adjusted to be positioned at the vicinity of the center. Note, an optical-to-electric transducer must be provided at the input side, and an electric-to-optical transducer at the output side, in the regenerating repeater 10.

Conventionally, when the phase adjusting means 13 is constituted by a delay line, the above phase synchronization between the signal DT and the clock signal CK is performed by slightly advancing or delaying the phase of the clock signal CK in such a manner that the delay line (cable) 13 is gradually and manually cut, by observing the waveforms displayed on an oscilloscope.

It is, however, troublesome to adjust the phase, and further, it is difficult to obtain a precise result because the operation is manually conducted.

An explanation is given hereinafter of a phase adjusting means 13 constituted by a filter consisting of an inductor, a capacitor, and a resistor.

Figure 2:
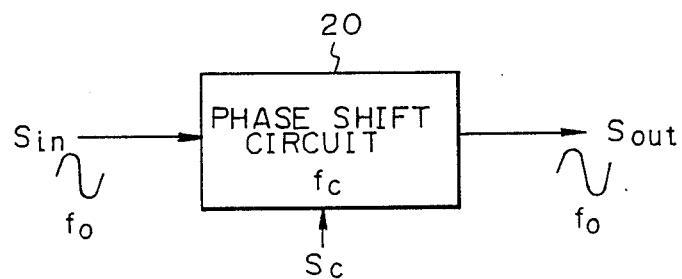
FIG. 2 is a block diagram of a prior art phase shift circuit using a filter consisting of inductors, capacitors and resistors.

FIG. 2 is a block diagram of a phase shift circuit using a filter consisting of inductors (L), capacitors (C), and resistors (R). This phase shift circuit 20 is provided in the phase adjusting means 13. The input signal $S_{in}$ and the output signal $S_{out}$ have a frequency $f_0$, but the phase of the output signal $S_{out}$ is different from that of the input signal $S_{in}$. To adjust the phase difference, the phase control signal $S_c$ is applied from an external stage (not shown) to the phase shift circuit 20 and the center frequency $f_c$ of the filter is shifted by the phase control signal $S_c$.

Figure 3:
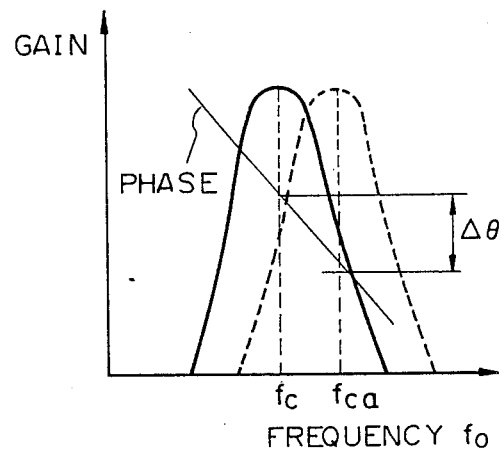
FIG. 3 is a graph for explaining a phase shift of the filter shown in FIG. 2.

FIG. 3 is a graph for explaining the phase shift of the filter shown in FIG. 2. In FIG. 3, the ordinate is a gain, and the abscissa is a frequency. The center frequency $f_c$ is shifted to the frequency $f_{ca}$ by changing the phase control signal $S_c$ so that the phase difference $\Delta\theta$ is added to the input signal $S_{in}$.

Figure 4:
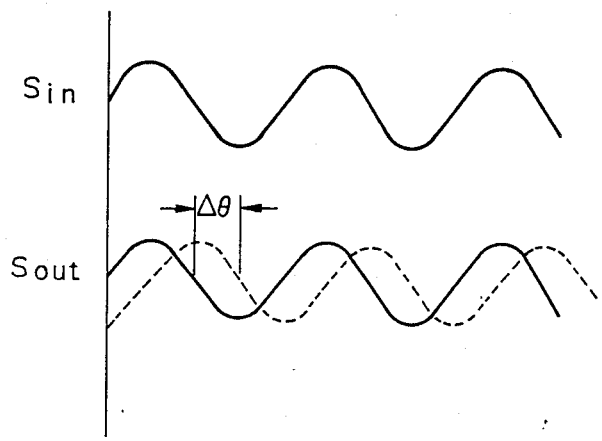
FIG. 4 is a graph for explaining waveforms of an input signal and an output signal.

FIG. 4 is a graph for explaining the waveforms of the input signal $S_{in}$ and the output signal $S_{out}$. In FIG. 4, the dotted line denotes the output signal shifted by the phase difference $\Delta\theta$.

As explained above, the phase shift circuit 20 is constituted by a filter consisting of an inductor L, a capacitor C, and a resistor R, and accordingly, a variable inductor and variable capacitor must be provided for adjusting the center frequency, and therefore, it is difficult to obtain a wide band filter. Further, it is difficult to adjust the variable inductor and the variable capacitor when the frequency of the input signal becomes high, and still further, these elements are too large to enable a miniaturization of the phase shift circuit.

Therefore, the object of the present is to provide a phase shift circuit constituted by a plurality of semiconductors, enabling an integration circuit and an adjustment of the phase shift of the input signal of from 0° to 360°.

Figure 5:
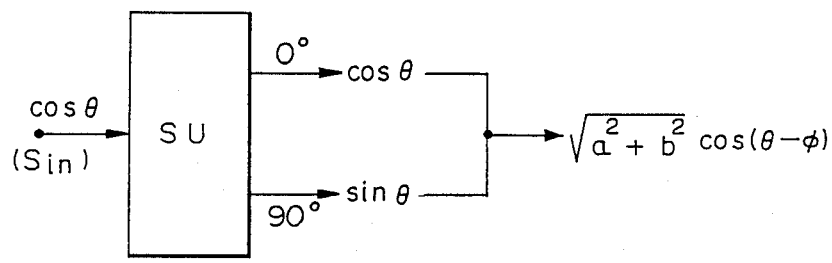
FIG. 5 is a block diagram for explaining the principle of the present invention.

FIG. 5 is a block diagram for explaining the principle of the present invention. In FIG. 5, SU is a separating unit. When a waveform of the input signal $S_{in}$ is expressed by "cos$\theta$", the signal having the phase difference 90° is given by "sin$\theta$". Accordingly, the combined signal cos$\theta$ and sin$\theta$ is given by the formula, $$\sqrt{a^2 + b^2} \cos(\theta - \phi)$$

Where, "a" and "b" are an amplitude of the signal, "$\phi$" is a shift angle and expressed by $\tan^{-1}(b/a)$. Accordingly, the shift angle $\phi$ can be adjusted by controlling both amplitudes "a" and "b" of the signals cos$\theta$ and sin$\theta$, as explained in detail hereinafter. As is obvious, since the maximum shift angle $\phi$ is 90°, the shift angle of from 0° to 360° can be obtained by combining a plurality of sets of the shift angle from 0° to 90°.

Figure 6:
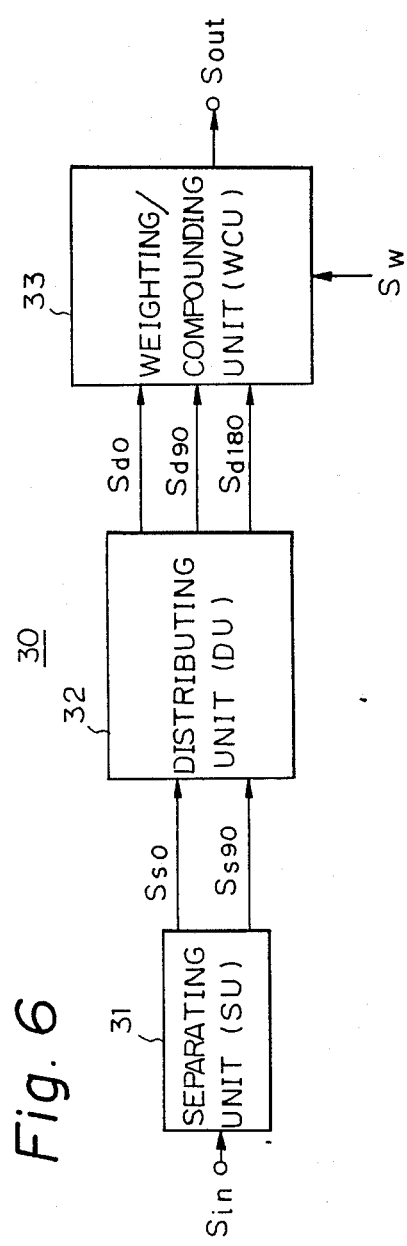
FIG. 6 shows a basic structure of the phase shift circuit according to the present invention.

FIG. 6 is a basic structure of the phase shift circuit according to the present invention. In FIG. 6, 31 denotes a separating unit, 32 a distributing unit, and 33 a weighting/compounding unit. The separating unit 31 receives the input signal $S_{in}$ and generates the first signal $S_{s0}$ and the second signal $S_{s90}$. The first signal $S_{s0}$ has the same phase as that of the input signal $S_{in}$, and the second signal $S_{s90}$ has a phase difference of 90° ($\pi/2$) from the first signal $S_{s0}$.

The distributing unit 32 receives the signal $S_{s0}$ and the signal $S_{s90}$ and generates the "0" phase distributed signal $S_{d0}$, "$\pi/2$" phase distributed signal $S_{d90}$, and "$\pi$" phase distributed signal $S_{d180}$. The distributing unit 32 is basically provided for obtaining a phase difference of 180° between two output signals.

The weighting/compounding unit 33 receives the signals $S_{d0}$, $S_{d90}$, $S_{d180}$, analyzes these signals regarding various kinds of the phase signals each having a predetermined phase shift extent, and compounds the phase signals after weighting the amplitude. In this case, a weight control signal $S_w$ is applied to the weighting-/compounding unit 33 for deciding the above weight of the amplitude. The phase shift angle $\phi$ of the output signal $S_{out}$ to the input signal $S_{in}$ is based on the weighted amplitude.

As shown in FIG. 5, the signal $S_{s0}$ is expressed by "$\cos \theta$" and the signal $S_{d90}$ is expressed by "$\sin\theta$". Accordingly, the weighting/compounding unit 33 calculates the formula, $$a \cos\theta + b \sin\theta = \sqrt{a^2 + b^2} \cos(\theta - \phi),$$

and controls the ratio "a : b" of the amplitude "a" and "b" based on the weight control signal $S_w$. Therefore, various kinds phase shift signals each having a separated phase shift extent must be provided to cover the shift angle $\phi$ from 0° to 360°, as explained in detail hereinafter.

As is obvious from the above explanation, since the phase shift circuit according to the present invention can control the phase shift angle $\phi$ based on the typical phase shift signals of 0°, 90° and 360°, the variable inductor and capacitor are not needed for adjusting the shift angle and it is possible to realize the adjustment by using only a plurality of semiconductors.

Figure 7:
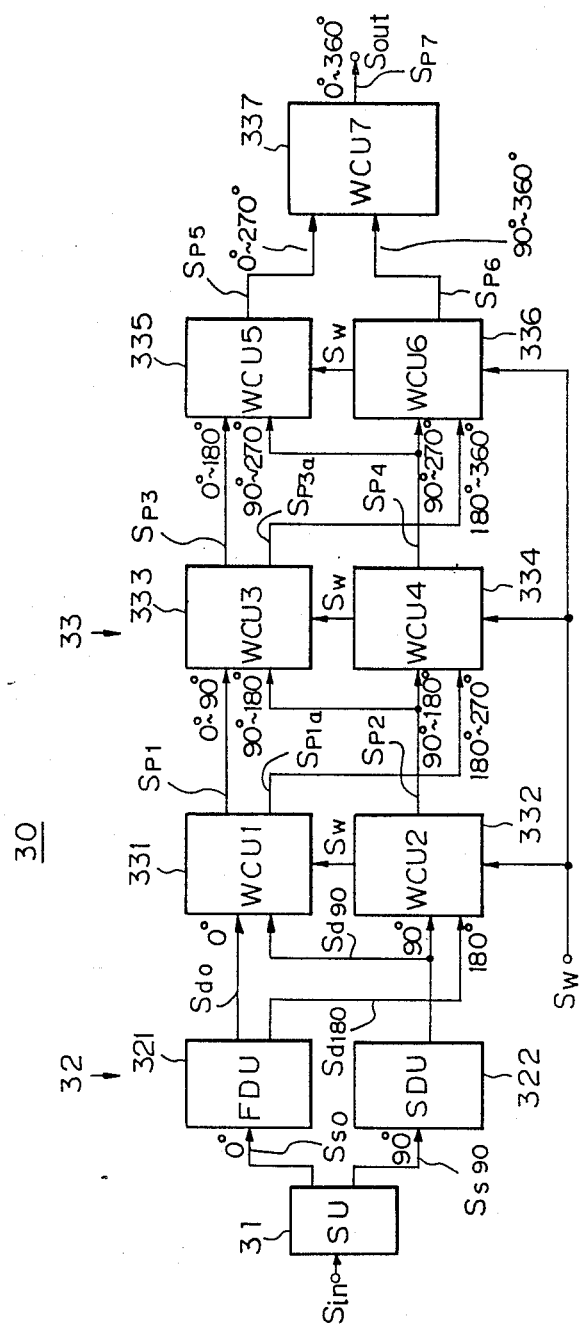
FIG. 7 is a schematic block diagram of the phase shift circuit according to an embodiment of the present invention.

FIG. 7 is a schematic block diagram of the phase shift circuit according to an embodiment of the present invention. In FIG. 7, the distributing unit 32 comprises a first distributing unit (FDU) 321 and a second distributing unit (SDU) 322. The FDU 321 receives the signal $S_{s0}$, and the SDU 322 receives the signal $S_{s90}$. The FDU 321 generates two distributed signals $S_{d0}$ and $S_{d180}$ having the phase difference 180° therebetween, and the SDU 322 generates two distributed signals $S_{d90}$ and a $3\pi/2$ phase distributed signal, but the $3\pi/2$ phase distributed signal is not used in this circuit. The weighting-/compounding unit 33 comprises seven weighting-/compounding units 331 to 337 (WCU 1 to WCU 7) each having the same structure. Each of the WCU's receives the weight control signal $S_w$ in common. If the weight control signal is different at each WCU, the phase shift extent as shown in the drawing can not be always obtained.

The phase signals, each of which is received and output by each of the WCU's, are denoted by $S_{P1}$ to $S_{P7}$. The phase signal $S_{P7}$ is similar to the output signal $S_{out}$. Each phase signal comprises the phase shift extent shown by 0° to 90°, 90° to 180°, 90° to 270°, etc., in the drawing. Various transmission routes of the phase signal are formed from the separating unit 31 to the WCU 7 and the output signal $S_{out}$ is generated from the WCU 7.

Figure 8:
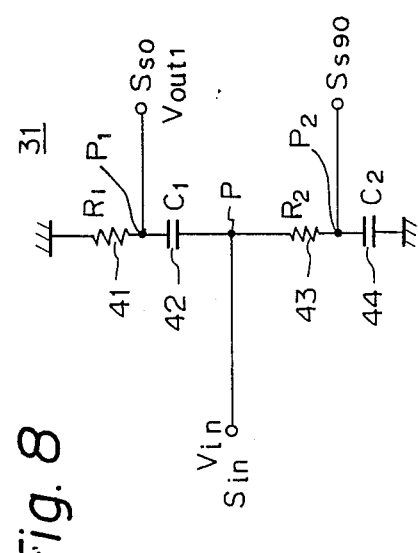
FIG. 8 is one example of a circuit of the separating unit shown in FIG. 7.

FIG. 8 is one example of a circuit of the separating unit shown in FIG. 7. In FIG. 8, the separating unit 31 is constituted by resistors $R_1$, $R_2$ and capacitors $C_1$, $C_2$, to obtain a constant amplitude. The input signal $S_{in}$ is input to the common connection point P. The first output signal $S_{s0}$ '45° advanced in phase to the input signal ' is output from the common connection point $P_1$ and the second output signal $S_{s90}$' 45° delayed in phase to the input signal ' is output from the common connection point $P_2$.

Figure 9:
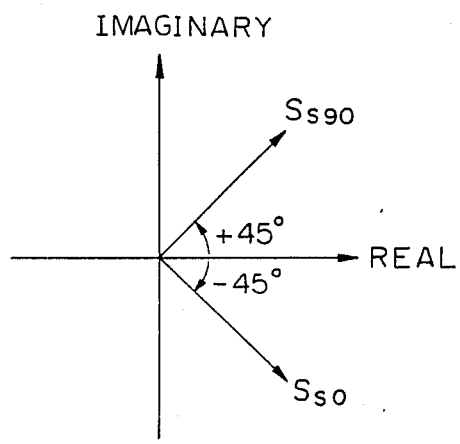
FIG. 9 is a graph of a complex number of explaining the phase difference between first and second signals.

FIG. 9 is a graph of a complex number for explaining the phase between the first and the second signals. The ordinate is an imaginary number axis and the abscissa is a real number axis. The conditions for obtaining the phase difference 90° between the input and the output signals are explained in detail as follows:

$$V_{out1} = \frac{R_1}{R_1 - j/\omega C_1} \cdot V_{in} \quad (1)$$

$$V_{out2} = \frac{-j/\omega C_2}{R_2 - j/\omega C_2} \cdot V_{in} \quad (2)$$

Where, $V_{in}$ is the voltage of the input signal, and $V_{out1, 2}$ are the voltages of each output signal. Accordingly, when $R_1$ and $R_2$ are given by $$R_1 = 1/\omega C_1 \quad (3)$$

$$R_2 = 1/\omega C_2 \quad (4)$$

and as a result, $$V_{out1} = (1+j) V_{in}/2 \quad (5)$$

$$V_{out2} = (1-j) V_{in}/2 \quad (6)$$

Therefore, the phase difference of 90° between the output signals is obvious from the above formulae (5) and (6).

Figure 10:
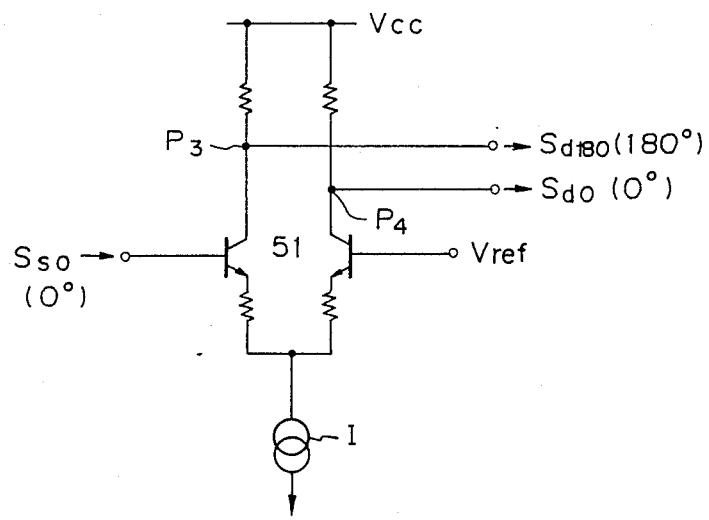
FIG. 10 is one example of the distributing circuit shown in FIG. 7.

FIG. 10 is one example of the distributing circuit shown in FIG. 7. This circuit is constituted by a differential amplifier. In FIG. 10, $V_{ref}$ denotes a reference voltage, I denotes a constant current source, and $V_{cc}$ denotes a power source. When the voltage of the input signal $S_{s0}$ is higher than the reference voltage $V_{ref}$, the output signal $S_{d180}$ is output from the point $P_3$. When the voltage of the input signal is lower than the reference voltage $V_{ref}$, the output signal $S_{d0}$ is output from the point $P_4$. This circuit can obtain a phase difference of 180° between two output signals.

Figure 11:
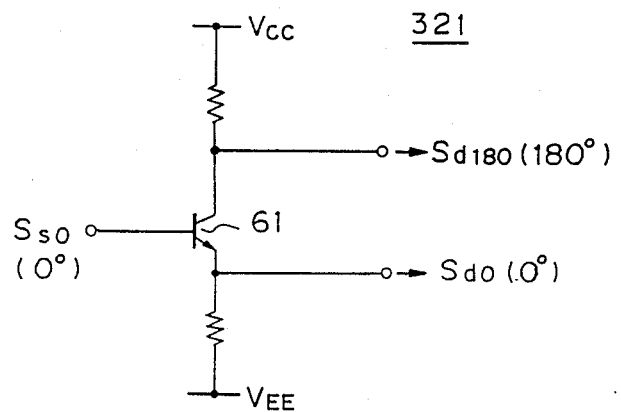
FIG. 11 is another example of the distributing circuit shown in FIG. 7.

FIG. 11 is another example of the distributing circuit shown in FIG. 7. This circuit is constituted by only one NPN-type or PNP-type transistor 61. In FIG. 11, the transistor 61 is an NPN-type. When the input signal $S_{s0}$ is input to the base of the transistor, the output signal $S_{d0}$ having a phase "0°" is output from the emitter when the input signal is high, and the output signal $S_{d180}$ having a phase of "180°" therefrom is output from the collector when the input signal is low. When a PNP-type transistor is used, the above output signal is inverted.

Figure 12:
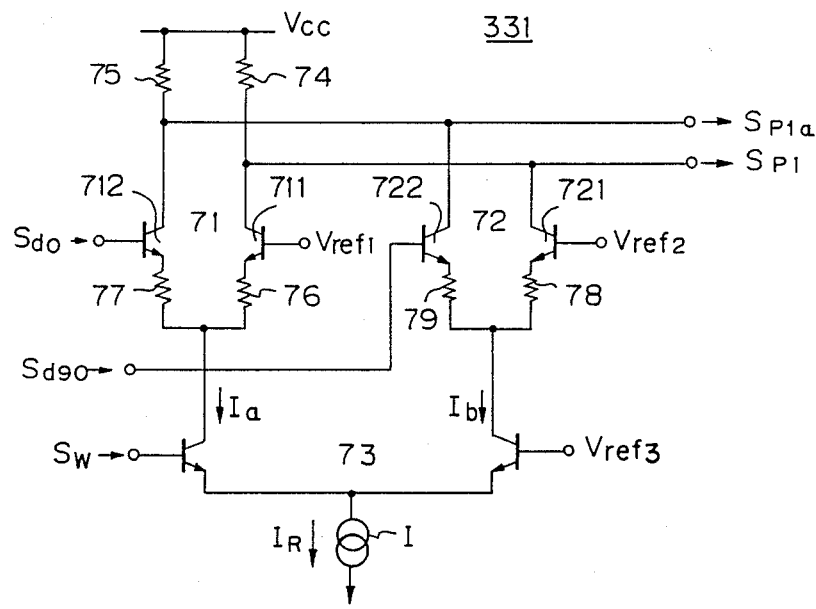
FIG. 12 is one example of the weighting/compounding circuit shown in FIG. 7.

FIG. 12 is one example of the weighting/compounding circuit shown in FIG. 7. This circuit is constituted by a first differential amplifier 71, a second differential amplifier 72 and a third differential amplifier 73. I denotes a constant current source. $V_{ref1}$, $V_{ref2}$, and $V_{ref3}$ are references voltages, and $I_a$ and $I_b$ are emitter currents (below, weight currents). The distributed signal $S_{d0}$ is input to the first differential amplifier 71, the signal $S_{d90}$ is input to the second differential amplifier 72, and the weight control signal $S_w$ is input to the third differential amplifier. The phase signals $S_{P1}$ and $S_{P1a}$ are output from the collectors of the differential amplifiers 71 and 72. The third differential amplifier 73 takes the weight currents $I_a$ and $I_b$ from common emitters of the first and second differential amplifiers 71 and 72. This type is advantageous when forming an integrated circuit, and a stable operation can be obtained by the differential input.

The current ratio between the weight currents $I_a$ and $I_b$ depends on the voltage balance between the voltage of the weight control signal $S_w$ and the reference voltage $V_{ref3}$, as explained in detail hereinafter.

The current ratio $I_a : I_b$ is equivalent to the amplitude ratio "a : b" at the formula of the shift angle $\phi$ ($=\tan^{-1}(b/a)$), and accordingly, the shift angle $\phi$ can be arbitrarily adjusted based on the control of the weight currents $I_a$ and $I_b$. For example, when the reference voltage $V_{ref3}$ is 0 (v) and the voltage of the weight control signal $S_w$ is changed between $\pm 3$ (v), the weight currents $I_a$ and $I_b$ can be changed between a maximum value and a minimum value. In this case, since the sum of the current $I_a$ and $I_b$ becomes a constant current value $I_R$, the current $I_a$ is maximum when the current $I_b$ is minimum, and the current $I_a$ is minimum when the current $I_b$ is maximum.

When the amplitude ratio "a : b" is changed from "1 : 0" to "0 : 1", the shift angle $\phi$ can be changed from 0° to 90°. Accordingly, since the phase shift extent of the phase signal $S_{p1}$ is from 0° to 90°, as shown in FIG. 7, the current $I_a$ is minimum and the current $I_b$ is maximum when the phase signal $S_{p1}$ is set to 0°, and the current $I_a$ is maximum and the current $I_b$ is minimum when the phase signal $S_{p1}$ is set to 90°. Further, the current $I_a$ is equal to the current $I_b$ (i.e., a half of the current $I_R$) when the phase signal $S_{p1}$ is set to 45°.

As explained above, the level of the current depends on the voltage of the weight control signal. For example, when the voltage of the weight control signal is $\pm$ (v), the current $I_a$ is maximum (current $I_b$ is minimum), and when the voltage of the weight control signal is $-3$ (v), the current $I_a$ is minimum (current $I_b$ is maximum).

The phase signals $S_{pl}$ and $S_{pla}$ can be obtained by compounding each distributed signal $S_{d0}$ and $S_{d90}$, since the load resistors 74 and 75 are common thereto. Namely, the phase signal $S_{p1}$ can be obtained because the load resistor 74 is common to the transistors 711 and 721. Similarly, the phase signal $S_{pla}$ can be obtained because the load resistor 75 is common to the transistors 712 and 722.

Figure 13:
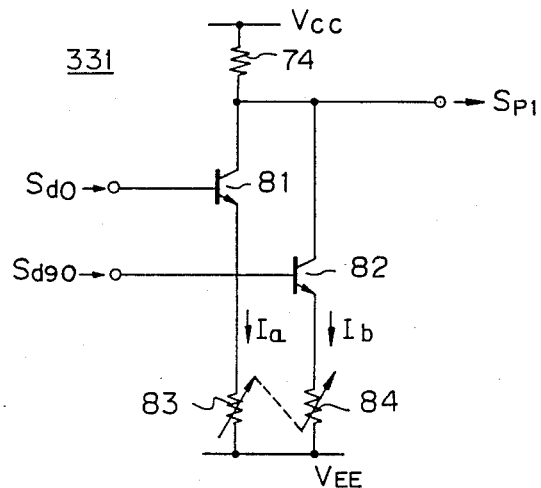
FIG. 13 is another example of the weighting/compounding circuit shown in FIG. 7.

FIG. 13 is another example of the weighting/compounding circuit shown in FIG. 7. In FIG. 13, 81 and 82 are NPN-type transistors and 83 and 84 are variable resistors. The phase signal $S_{p1}$ is output from the collector of the transistors 81 and 82. The distributed signal $S_{d0}$ is input to the base of the transistor 81, and the distributed signal $S_{d90}$ is input to the base of the transistor 82. The semifixed variable resistors 83 and 84 can adjust the value of the weight currents $I_a$ and $I_b$ by rotating an arm therein. In this case, the semifixed variable resistor 83 is linked with the resistor 84 and these resistors are wired to obtain an inverse value between these currents. Namely, when the current $I_a$ is large, the current $I_b$ becomes small. The weight control signal $S_w$ is not necessary in this type circuit because the semifixed resistor is previously adjusted. In general, such a semifixed variable resistor can be used in the regenerating repeater because, once the phase of the clock signal is adjusted by the semifixed variable resistor, the phase adjustment is not frequently performed after the initial adjustment.

Figure 14:
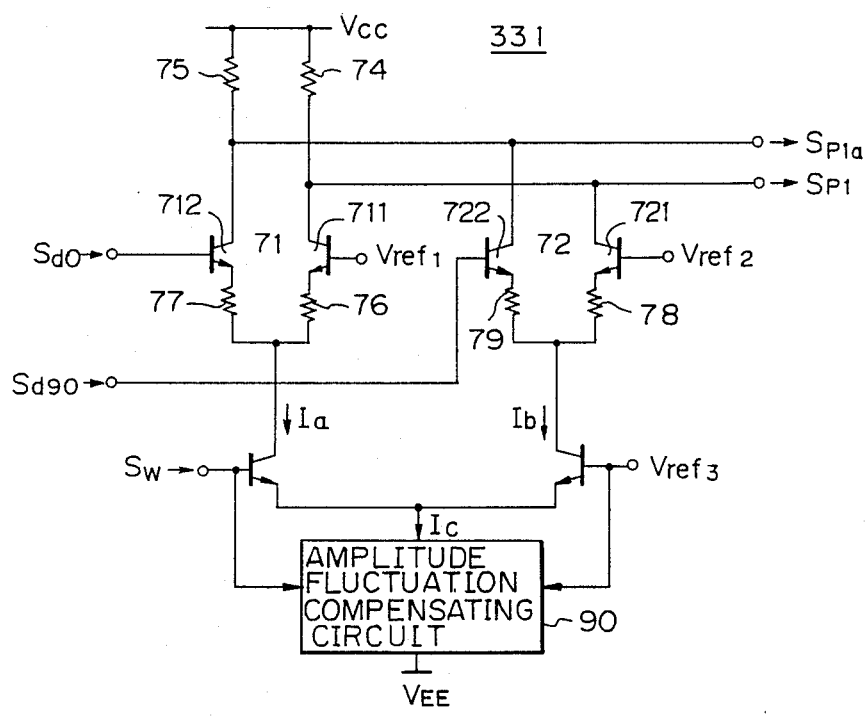
FIG. 14 is one example of the weighting/compounding circuit having an amplitude fluctuation compensating circuit.

FIG. 14 is one example of the weighting/compounding circuit having an amplitude fluctuation compensating circuit. The amplitude fluctuation compensating circuit 90 is provided instead of the constant current source I shown in FIG. 12 and $I_c$ is a sum of the weight current $I_a$ and $I_b$.

An explanation of why such a compensating circuit is necessary is given hereinafter.

When the gain of the first and second differential amplifiers 71 and 72 is $G_1$ and $G_2$ respectively the formula, $$\sqrt{a^2 + b^2} \cos(\theta - \phi)$$

can be expressed by, $$\pm \sqrt{G_1^2 + G_2^2} \cos(\theta - \phi) \tag{5}$$

Since the weight currents of the these amplifiers are $I_a$ and $I_b$, the gains $G_1$ and $G_2$ are expressed by:

$$G_1 = R_L \div (V_T/I_a + R_e) \tag{6}$$

$$G_2 = R_L \div (V_T/I_b + R_e) \tag{7}$$

where, $R_L$ is a resistance value of each of the load resistors 74 and 75, and $R_e$ is a resistance value of each of the emitter resistors 76 to 79 of the transistors 711, 712, 721, and 722. Further, $V_T$ is expressed by the formula:

$$V_T = kt/q \tag{8}$$

where, k is Bolzman constant, t is an absolute temperature, q is a charge quantity, and $V_T/I_a$ and $V_T/I_b$ are emitter resistance values of the transistor.

From the above formulae (6) to (8), since the gain is decided by the ratio of the load resistance value $R_L$ and the emitter resistance value $R_e$, which changes in accordance with the emitter current, it is obvious that the gains $G_1$ and $G_2$ change in response to the fluctuation of the weight currents $I_a$, $I_b$. This fluctuation is not preferable when performing a more precise phase shift operation, and therefore, the amplitude fluctuation compensating circuit must be provided in the weighting/compositing circuit. The fluctuation of the amplitude is explained hereinafter.

Figure 15:
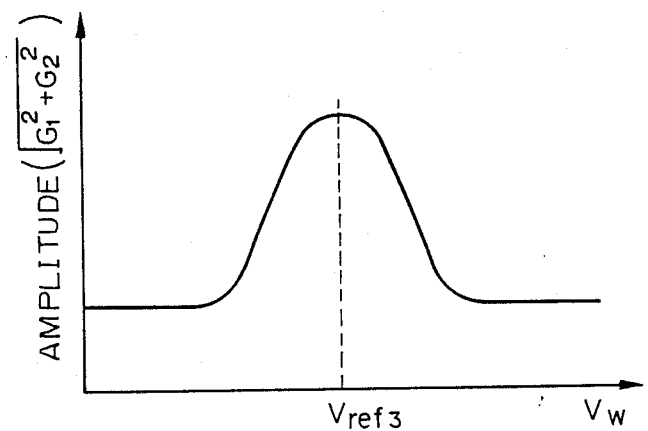
FIG. 15 is a graph for explaining the amplitude fluctuation.

FIG. 15 is a graph for explaining the amplitude fluctuation. In FIG. 15, the ordinate is an amplitude of the phase signal $S_{p1}$, $S_{p1a}$, and the abscissa is a voltage $V_w$ of the weight control signal $S_w$. As is obvious from the drawing, the amplitude becomes maximum when the voltage of the weight control signal is equal to the reference voltage $V_{ref3}$.

Figure 16:
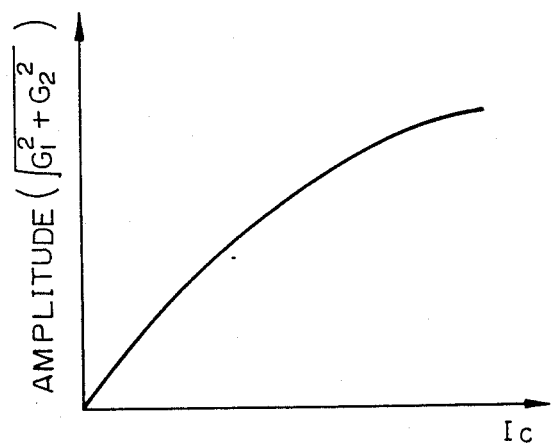
FIG. 16 is a graph for explaining the relationship between the amplitude and the sum of the weight currents.

FIG. 16 is a graph for explaining the relationship between the amplitude and the sum of the weight currents. The ordinate is an amplitude of the phase signal, and the abscissa is a sum of the weight currents. In FIG. 16, the current $I_c$ is equal to the sum of the weight current $I_a$ and $I_b$. As is obvious from the graph, the relationship between the amplitude and the current is approximately linear, and the greater the amplitude, the larger the current.

Figure 17:
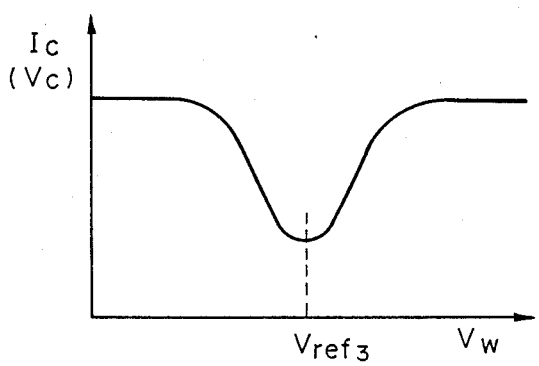
FIG. 17 is a graph for explaining the relationship between the voltage of the weight control signal and the sum of the weight currents.

FIG. 17 is a graph for explaining the relationship between the voltage $V_w$ of the weight control signal $S_w$ and the sum of the weight currents. As is obvious from the graph, the current $I_c$ becomes minimum when the voltage of the weight control signal is equal to the reference voltage $V_{ref3}$.

Figure 18:
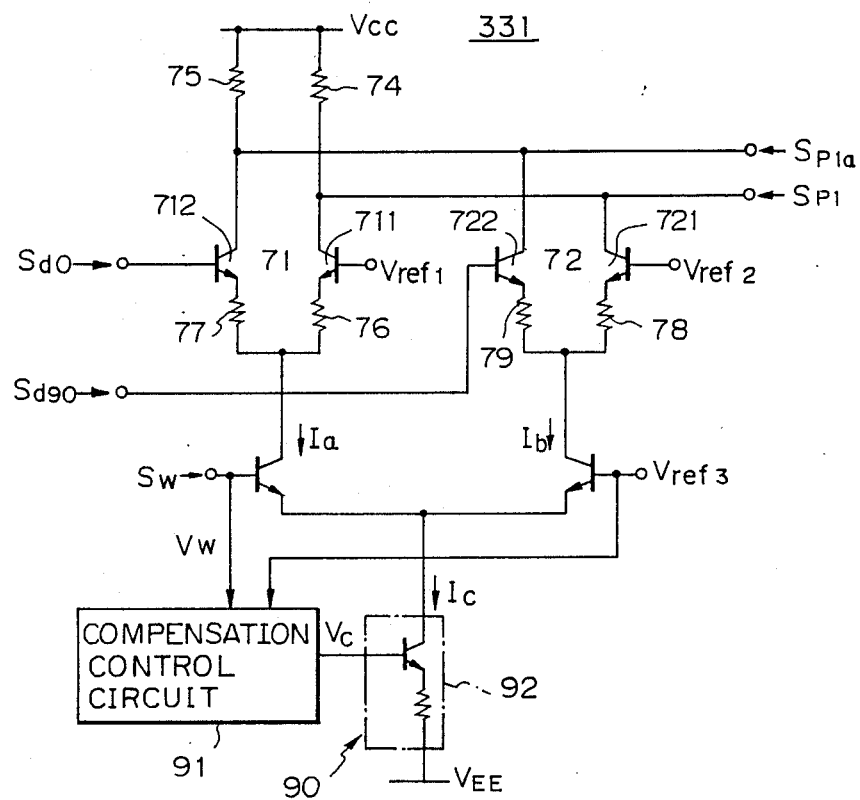
FIG. 18 is one example of the amplitude fluctuation compensating circuit of FIG. 14.

FIG. 18 is one example of the amplitude fluctuation compensating 90 of FIG. 14. This circuit is constituted by a compensation control circuit 91 and a current source circuit 92. The current source circuit 92 is controlled by a compensation control voltage $V_c$. The relationship between the voltage $V_c$ and the voltage is shown in FIG. 17. The compensation control circuit 91 is described in detail hereinafter.

Figure 19:
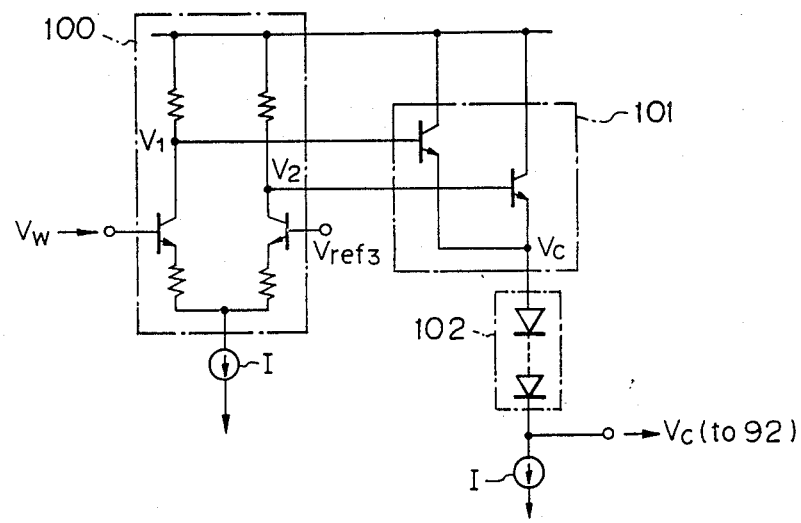
FIG. 19 is one example of a compensation control circuit FIG. 18.

FIG. 19 is one example of the compensation control circuit 91. In FIG. 19, 100 denotes a differential amplifier, 101 denotes a voltage compensating circuit, and 102 is a level shifter for adjusting the compensation control voltage $V_c$ to drive the current source circuit 92. This circuit 102 is constituted by a plurality of diodes for obtaining a voltage drop. The compensation control voltage $V_c$ is obtained from output voltages $V_1$ and $V_2$ of the differential amplifier 100. The voltage $V_w$ is the voltage of the weight control signal $S_w$.

Figure 20:
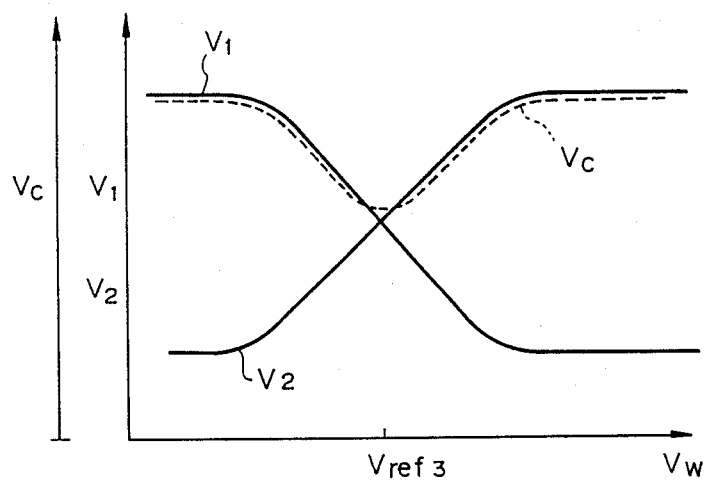
FIG. 20 is a graph for explaining each voltage in the compensation control circuit shown in FIG. 19.

FIG. 20 is a graph for explaining each voltage in the compensation control circuit shown in FIG. 19. Namely, this graph shows the relationship between the compensation control voltage $V_c$ and the weight control signal voltage $V_w$. The dotted line $V_c$ is defined by the curves of the voltages $V_1$ and $V_2$. The curve of the voltage $V_c$ corresponds to the curve shown in FIG. 17, and accordingly, the weight current $I_c$ is controlled in response to the control voltage $V_c$.

Figure 21:
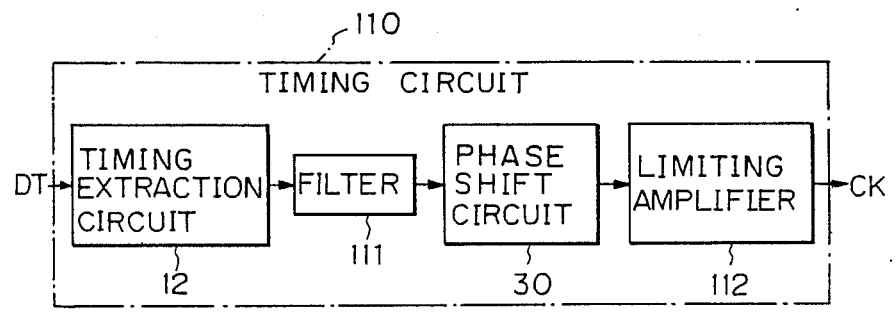
FIG. 21 is a partial block diagram of the regenerating repeater including the phase shift circuit according to the present invention.

FIG. 21 is a partial block diagram of the regenerating repeater including the phase shift circuit according to the present invention. In FIG. 21, reference number 111 denotes a filter and 112 denotes a limiting amplifier. The phase shift circuit 30 according to the present invention is provided between the filter 111 and the limiting amplifier 112. The clock signal CK is output from the limiting amplifier 112. Reference number 110 denotes a timing circuit and is constituted by the timing extraction circuit 12, the filter 111, the phase circuit 30, and the limiting amplifier 112. Since the phase shift circuit 30 is provided between the filter 111 and the limiting amplifier 112, it is possible to eliminate the jitter in the clock signal CK. This is because the gain of the limiting amplifier 112 is very high, and thus it is possible to shape the waveform of the clock signal CK.

Figure 22:
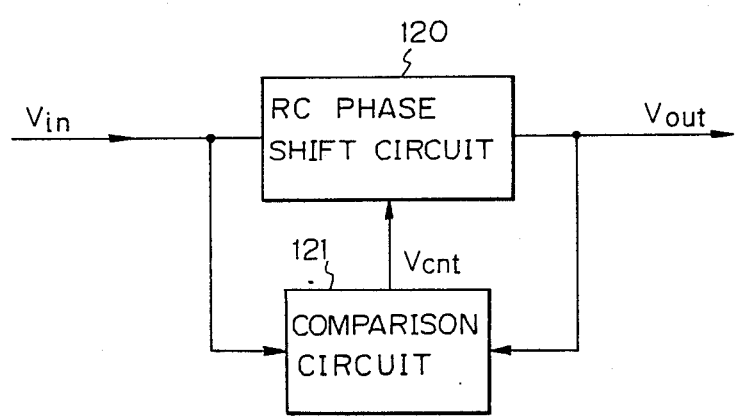
FIG. 22 is a basic structure of another example of the separating unit of FIG. 7, according to the present invention.

FIG. 22 is a basic structure of another example of the separating unit of FIG. 7 according to the present invention. This circuit can compensate a frequency change of the input signal and maintain the phase shift quantity of the output signal at a constant value.

As explained above, the separating circuit shown in FIG. 8 is constituted by resistors and capacitors, so that the output signals are given by the formulae (5) and (6). Accordingly, it is necessary to satisfy the formulae (3) and (4) to obtain the precise phase difference of 90° between the output signal $V_{out1}$ and the output signal $V_{out2}$. In this case, when the resistance $R_1$ is equal to $R_2$ and the capacitance $C_1$ is equal to $C_2$, the resistance R is given by $1/\omega C$ from the formulae (3) and (4). Therefore, the frequency of the input signal $f_0$ is given by, $$f_0 = \omega/2\pi = \tfrac{1}{2}\pi CR$$

Accordingly, the frequency $f_0$ can be obtained from the values of the resistor and capacitor. Therefore, when the frequency $f_0$ changes, the phase difference between the output signals also changes from 90°, and thus it is difficult to maintain the phase difference between the output signals for the change of the frequency of the input signal $V_{in}$.

To solve the above problem, there is provided a phase shift circuit enabling a compensation of a change of the input frequency shown in FIG. 22. In FIG. 22, 120 denotes a RC phase shift circuit, 121 a comparison circuit, and $V_{cnt}$ a control signal. The RC phase shift circuit 120 is constituted by variable capacitors and resistors, or by variable resistors and capacitors. The comparison circuit 121 compares the voltage of the input signal $V_{in}$ with the voltage of the output signals $V_{out1}$ or $V_{out2}$ and outputs the control signal $V_{cnt}$ to obtain a predetermined ratio between the input signal and the output signal.

Figure 23:
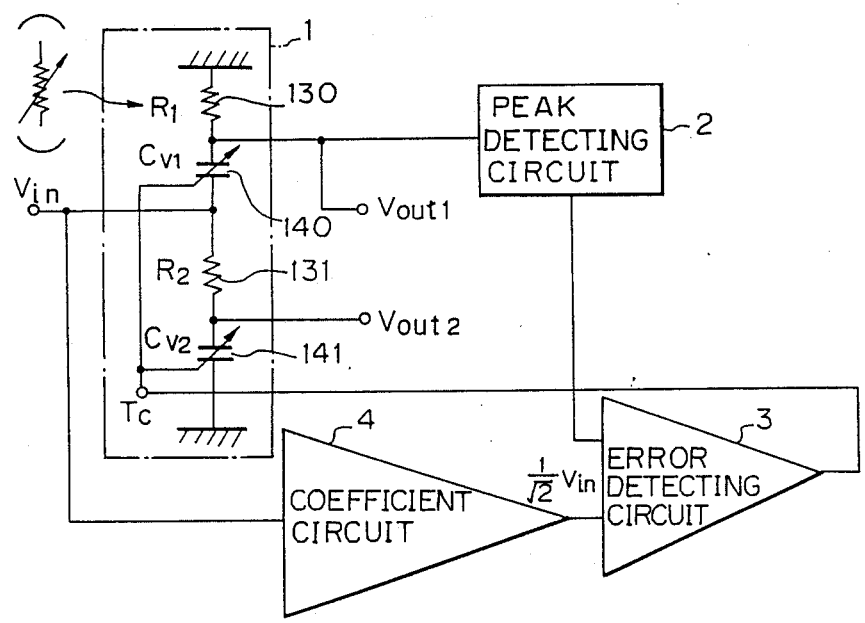
FIG. 23 is a detailed structure of the phase shift circuit shown in FIG. 22.

FIG. 23 is a detailed structure of the phase shift circuit shown in FIG. 23. In FIG. 23, 1 denotes a phase circuit, 2 a peak detecting circuit, 3 an error detecting circuit, and 4 a coefficient circuit. The phase circuit 1 is constituted by resistors 130 and 131, and voltage control type variable capacitors 140 and 141. The resistor 130 and the variable capacitor 140 constitute a low pass filter, and the output signal $V_{out1}$ is controlled to be advanced by the phase difference of 45° to the input signal. The resistor 131 and the variable capacitor 141 constitute a high pass filter, and the output signal $V_{out2}$ is controlled to be delayed by the phase difference of 45° to the input signal. Accordingly, it is possible to obtain a phase difference of 90° between the output signals The peak detecting circuit 2 detects a peak value of the output signal $V_{out1}$ and a detected peak value is input to one input terminal of the error detecting circuit 3. The coefficient circuit 4 multiplies the input signal $V_{in}$ by the coefficient $1\sqrt{2}$, and the multiplied output is input to the other input terminal of the error detecting circuit 3. The output of the error detecting circuit 3 is input to a voltage control terminal $T_c$ of the variable capacitors 140 and 141.

The operation of the phase shift circuit is explained as follows. As explained above, the following relationship must be established to maintain the phase difference of 90° between the output signals:

$$R_1 = 1/\omega C_{v1} \qquad (7)$$

$$R_2 = 1/\omega C_{v2} \qquad (8)$$

When the above formulae are satisfied, the output signal $V_{out1}$ has the phase angle of 45° to the input signal $V_{in}$ and the amplitude of the output signal $V_{out1}$ is expressed as follows from the formula (5)

$$|V_{out1}| = V_{in}/\sqrt{2} \qquad (9)$$

The same relationship as in formula (9) is given to the output signal $V_{out2}$.

To maintain the phase difference of 90° between the output signals $V_{out1}$ and $V_{out2}$ on a change of the frequency of the input signal $V_{in}$, the formulae (7) and (8) must be satisfied. To satisfy the formulae (7) and (8) on a change of the input frequency $f_0$, it is necessary to change the capacitances $C_{v1}$ and $C_{v2}$ of the capacitors 140 and 141.

Accordingly, the peak detecting circuit 2 detects the peak value of the amplitude of the output signal $V_{out1}$, and the error detecting circuit 3 compares the peak value with the output signal $V_{in}/\sqrt{2}$ and outputs the control signal $V_{cnt}$ to adjust the capacitance of the capacitors 140 and 141 so that the peak value becomes equal to the $V_{in}/\sqrt{2}$. As a result, it is possible to maintain a precise phase difference of 90° between the output signals and the input signal $V_{in}$.

Although the above embodiment uses variable capacitors and fixed resistors, it is possible to provide variable resistors and fixed capacitors to the extent that fluctuation of the input impedance is negligible.

Figure 24:
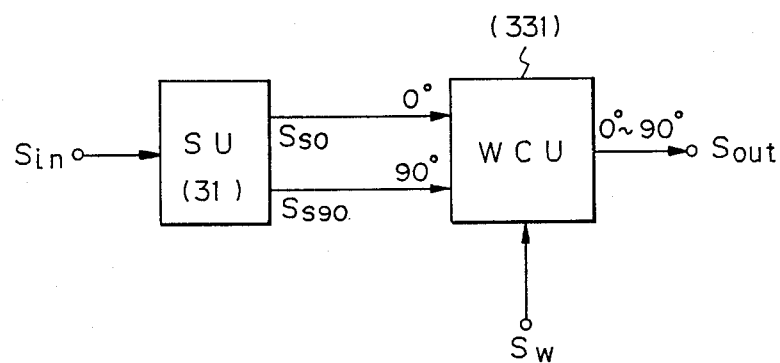
FIG. 24 is a block diagram of another embodiment of the phase shift circuit according to the present invention.

FIG. 24 is a block diagram of another embodiment of the phase shift circuit according to the present invention. This phase shift circuit can shift the phase shift angle from 0° to 90°. As is obvious from the drawing, this circuit is only constituted by the separating unit 31 and the weighting/compounding unit 331, and the distributing unit 32 for obtaining the phase difference of 180° therebetween is not provided. A detailed circuit diagram can be obtained by combining the circuits shown in FIGS. 8 and 12. Although the 0° to 90° phase shift circuit is explained in this embodiment, it is possible to obtain other variations by changing the setting of the weighting/compounding circuit as explained hereinafter.

Figure 25:
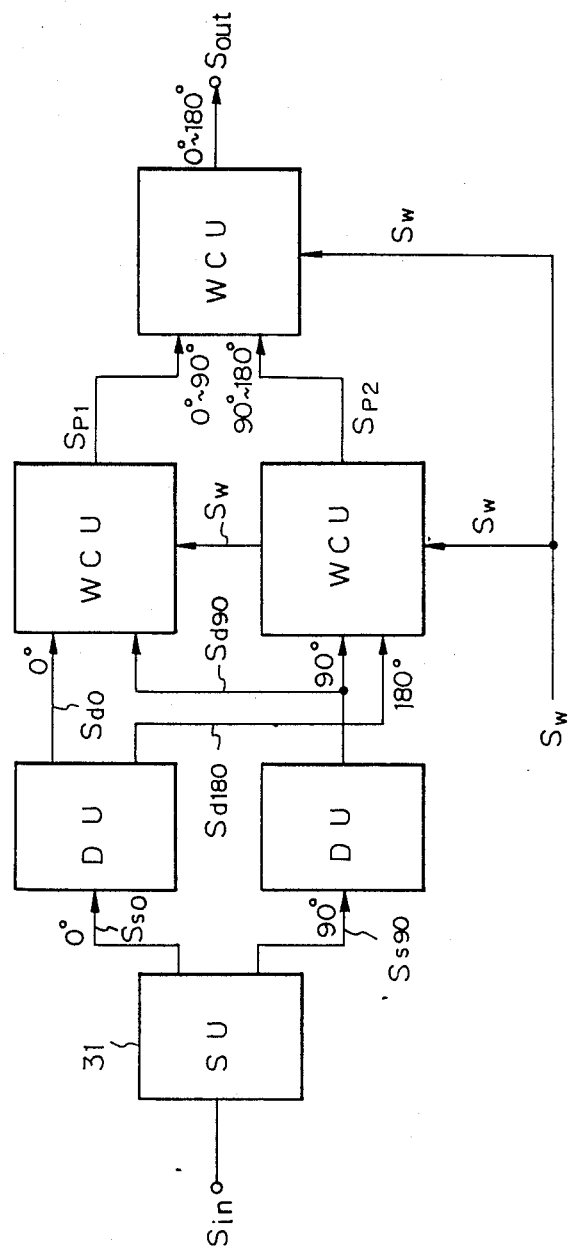
FIG. 25 is a block diagram of still another embodiment of the phase shift circuit according to the present invention.

FIG. 25 is a block diagram of another embodiment of the phase shift circuit according to the present invention. This circuit can shift the phase shift angle from 0° to 180°. This circuit is constituted by the separating unit 31 two distributing units Du and three weighting/compounding units WCU so that it is possible to obtain a phase shift angle of from 0° to 180° from the final stage.

Figure 26:
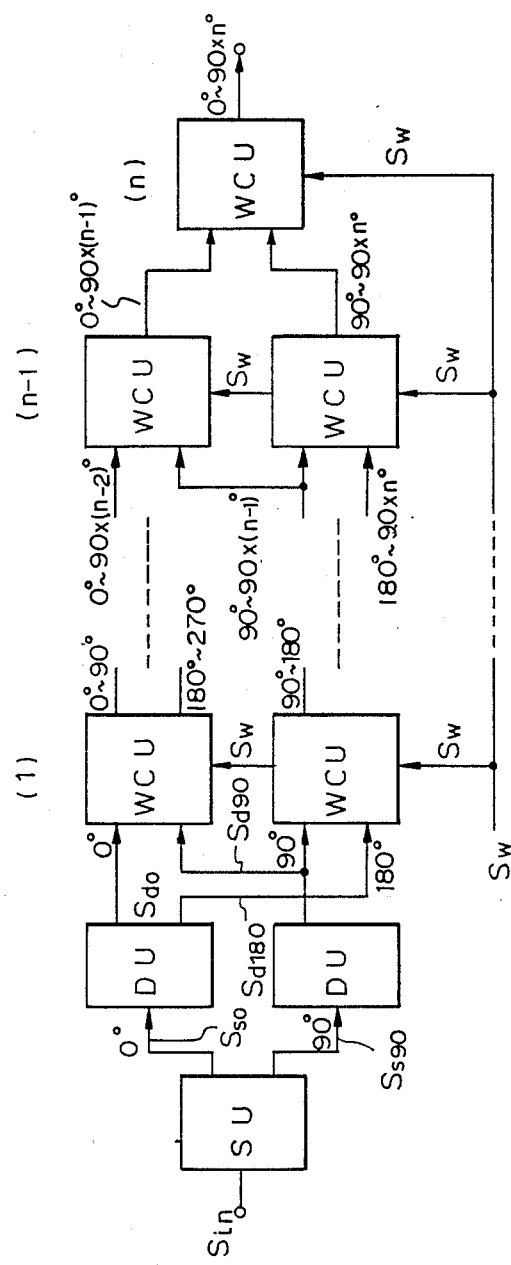
FIGS. 26 and 27 are block diagrams for explaining the general form of the phase shift circuit according to the present invention.
Figure 27:
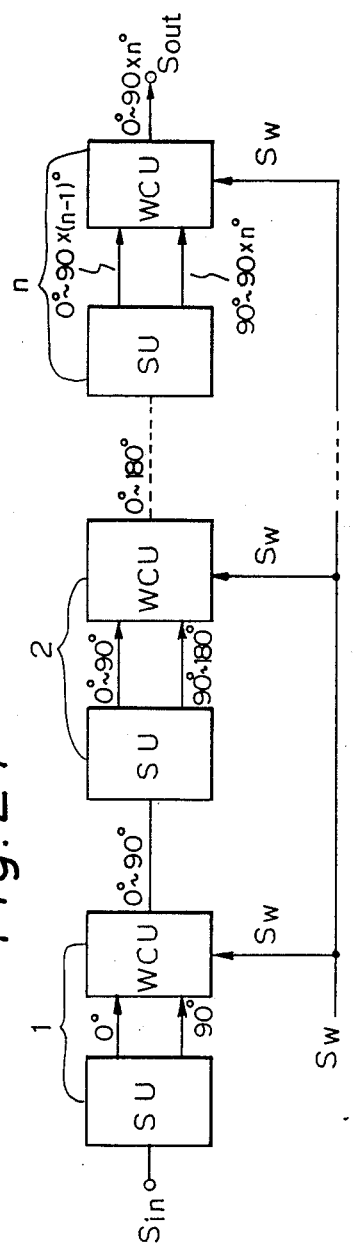

FIGS. 26 and 27 are block diagrams for explaining a general form of the phase shift circuit according to the present invention. In the circuit shown in FIG. 26, "n−1" pairs of the WCU's and one WCU are provided for obtaining the phase shift angles of from 0° to 90°×n°. Where, "n" is 1, 2, . . . .

In the circuit shown in FIG. 27, each stage is constituted by the phase shift circuit shown in FIG. 24.

Figure 28:
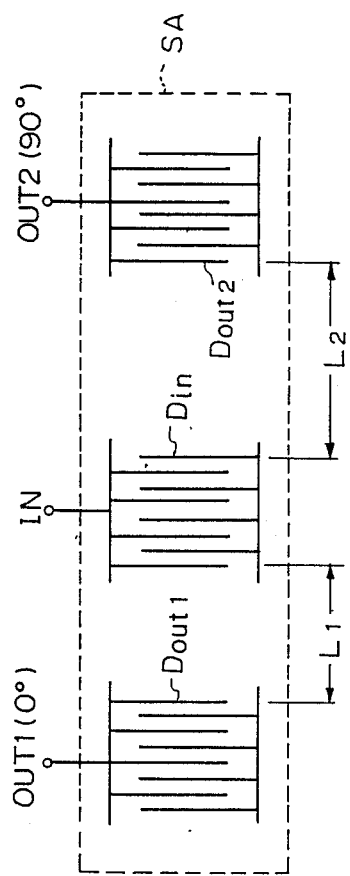
FIG. 28 is a still another embodiment of the phase shift circuit according to the present invention.

FIG. 28 is still another embodiment of the phase shift circuit according to the present invention. In FIG. 28, SA is a surface acoustic waves (SAW) filter constituted by an input transducer $D_{in}$ and two output transducers $D_{out1}$ and $D_{out2}$. In general, the SAW filter is able to change the phase difference between the input signal and the output signal. The phase difference can be obtained by changing the distance between the input transducer and the output transducer. Accordingly, it is possible to obtain the output signals OUT1 and OUT2 each having phase differences 0° and 90° to the input signal IN by providing two output transducers $D_{out1}$ and $D_{out2}$. The delay times $t_1$ and $t_2$ of the output signals OUT1 and OUT2 to the input signal are given by the following formulae:

$$t_1 = (L_1 + PK)/v_s$$

$$t_2 = (L_2 + PK)/v_s$$

where, P is a pitch between each of the comb line type electrodes, K is a number of pairs of comb line type electrodes, and $L_1$ and $L_2$ are distances between the input transducer $D_{out1}$ and $D_{out2}$ respectively and the output transducer.

Figure 29:
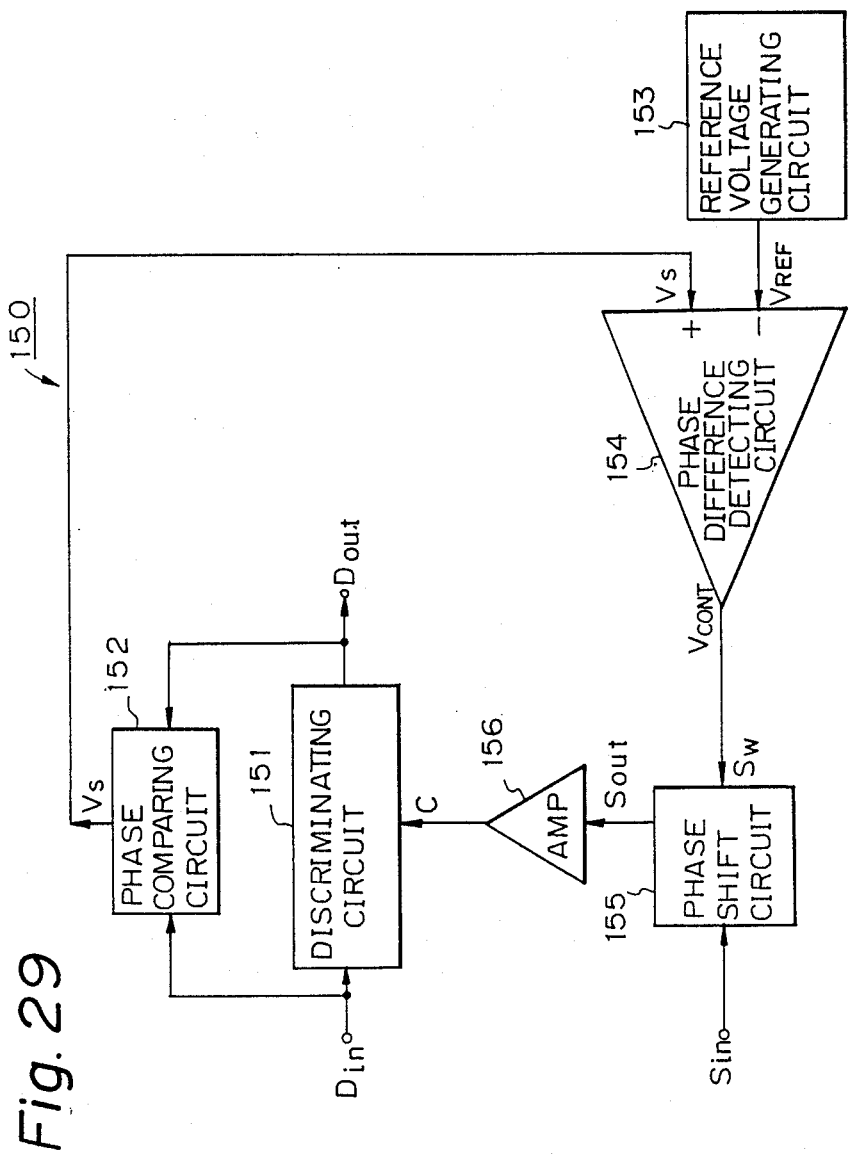
FIG. 29 is a block diagram of an automatic phase control circuit to which the present invention is applied.

FIG. 29 is a block diagram of an automatic phase control circuit to which the present invention is applied. In FIG. 29, 151 denotes a discriminating circuit, 152 a phase comparing circuit, 153 a reference voltage generating circuit, 154 a phase difference detecting circuit, 155 a phase shift circuit according to the present invention, and 156 an amplifier. The feature of this automatic phase control circuit 150 lies in the use of the phase shift circuit 155 for changing the phase of the input signal.

In this circuit, the phase comparing circuit 152 compares an input data $D_{in}$ with the phase of the clock signal (output data) $D_{out}$ and outputs a phase detecting signal $V_s$ as the resultant data. Although the phase comparing circuit compares the input data with the output data, this is equivalent to a comparison with the phase of the input clock signal since the output data is synchronized with the input clock signal. The reference voltage generating circuit 153 generates the reference voltage $V_{ref}$ when the phase relationship between the input data and the input clock signal becomes optimal. The phase difference detecting circuit 154 detects the difference between the phase detecting signal $V_s$ and reference signal $V_{ref}$, and generates a control voltage signal $V_{CONT}$. For example, when the phase is slipped between the input data and the input clock signal, the level of the phase detecting signal $V_s$ changes and a difference between the signal $V_s$ and the signal $V_{ref}$ arises. This difference is detected by the phase difference detecting circuit 154, and the phase control voltage $V_{CONT}$ is changed. The phase utilizes the phase control voltage signal $V_{CONT}$ as the weight control signal $S_w$. As explained above, the phase of the input clock signal can be adjusted based on the weight control signal $S_w$ through the amplifier 156. The amplifier 156 amplifies the amplitude of an output clock signal C from the phase shift circuit 155 and shapes the waveform of the output clock signal C.

The present invention has been described referring to several embodiments, however, the present invention permits various modifications within the scope of the subject matter of the present invention. Since numerous modifications and changes will readily occur to those skilled in the art, it is not desired to limit the invention to the exact construction and applications shown and described and accordingly, all suitable modifications and equivalents may be resorted to, falling within the scope of the invention and the appended claims and their equivalents.

We claim:

1. A phase shift circuit used in a regenerating repeater, comprising:
    separating means for separating an input signal into first and second separated signals having a phase difference of a phase angle of 90° therebetween, the first separated signal having a "0" phase and the other second separated signal having a "π/2" phase;
    distributing means for distributing said "0" phase separated signal and said "π/2" phase separated signal as three distributed signals having a phase difference of phase angles of 90° and 180° therebetween, a first distributed signal having a "0" phase and second and third distributed signals having a "π/2" phase and a "π" phase, respectively; and
    weighting/compounding means for analyzing said "0" phase distributed signal, said "π/2" phase distributed signal and said "π" phase distributed signal regarding a plurality of phase signals each having a phase shift extent, for compounding each of said phase distributed signals after being weighted by an amplitude, said weighting being performed by a weight control signal applied from an external stage, and for generating an output signal adding a phase shift proportional to said weighting to said input signal.

2. A phase shift circuit as claimed in claim 1, wherein said distributing means comprises a first and second distributing units inputting the "0" phase separated signal and the "π/2" phase separated signal, respectively; and said weighting/compounding means comprises a first weighting/compounding unit inputting the "0" phase distributed signal and the "$\pi/2$" phase distributed signal and outputting first and second phase signals having a phase shift extent of from 0° to 90° and from 180° to 270°, respectively, a second weighting/compounding unit inputting the "$\pi/2$" phase signal and the "$\pi$" phase distributed signal and outputting a third phase signal having a phase shift extent of from 90° to 180°, a third weighting/compounding unit inputting the first and third phase signals having a phase shift extent of from 0° to 90° and from 90° to 180°, respectively, and outputting fourth and fifth phase signals having a phase shift extent of from 0° to 180° and from 180° to 360°, respectively, a fourth weighting/compounding unit inputting the third and second phase signals having a phase shift extent of from 90° to 180° and from 180° to 270°, respectively, and outputting a sixth phase signal having a phase shift extent of from 90° to 270°, a fifth weighting/compounding unit inputting the fourth and sixth phase signals having a phase shift extent of from 0° to 180° and from 90° to 270°, respectively, and outputting a seventh phase signal having a phase shift extent of from 0° to 270°, a sixth weighting/compounding unit inputting the sixth and fifth phase signals having a phase shift extent of from 90° to 270° and from 180° to 360°, respectively, and outputting an eighth phase signal having a phase shift extent of from 90° to 360°, and a seventh weighting/compounding unit inputting the seventh and eighth phase signals having a phase shift extent of from 0° to 270° and from 90° to 360°, respectively and outputting a ninth phase signal having a phase shift extent of from 0° to 360°.

3. A phase shift circuit as claimed in claim 1, wherein said separating means comprises a first circuit consisting of a series-connected resistor and capacitor, and a second circuit consisting of a series-connected resistor and capacitor, said first and second circuits being connected in series, said input signal being input to a common connection point of said first circuit and second circuit, said "0" phase separated signal being output from a common connection point of said resistor and capacitor in the first circuit, and said "$\pi/2$" phase separated signal being output from a common connection point of said resistor and capacitor in the second circuit.

4. A phase shift circuit as claimed in claim 2, wherein said phase shift circuit is operatively connected to a current source, and
wherein each of said first and second distributing units comprises a differential amplifier having first and second transistors each including a base, an emitter and a collector, the "0" phase separated signal being input to the base of the first transistor, a reference voltage being input to the base of the second transistor to set a switching amplitude, the emitters of said first and second transistors are operatively connected to the current source, and said distributed signals being output from the collectors of said first and second transistors.

5. A phase shift circuit as claimed in claim 2, wherein each of said first and second distributing units comprises a transistor having a base, an emitter and a collector, said "0" phase and "$\pi/2$" phase separated signals being input to a base of the respective transistor, and said distributed signals being output from the collector and the emitter of said respective transistor.

6. A phase shift circuit as claimed in claim 2, wherein each of said first to seventh weighting/compounding units comprises a first differential amplifier having first and second transistors including first and second bases, collectors and emitters, respectively, a second differential amplifier having first and second transistors including first and second bases, collectors and emitters, respectively, connected in parallel to said first differential amplifier through respective first and second collectors, and a third differential amplifier having first and second transistors including first and second bases, collectors and emitters, respectively, connected to said first differential amplifier and second differential amplifier for taking weight currents through the first and second emitters of said first differential amplifier and second differential amplifier, said distributed signal being input to each first base of said first differential amplifier and second differential amplifier, first and second reference voltages being applied to each second base of said first differential amplifier and second differential amplifier, respectively, said weight control signal being input to the first base of said third differential amplifier, a third reference voltage being applied to the second base of said third differential amplifier, and said phase signal being output from the first and second collectors of said first differential amplifier and second differential amplifier.

7. A phase shift circuit as claimed in claim 2, wherein each of said first to seventh weighting/compounding units comprises first and second transistors, each having a base, an emitter and a collector, for respectively receiving the phase and distributed signals at their respective bases and outputting said respective phase signals from the respective collectors, and semifixed-resistors each connected to each of the emitters for adjusting said weight control signal passing through said transistors.

8. A phase shift circuit as claimed in claim 6, further comprising an amplitude fluctuation compensating unit for suppressing the amplitude fluctuation of said phase signal connected to the first and second emitters of said third differential amplifier.

9. A phase shift circuit as claimed in claim 8, wherein said amplitude fluctuation compensating unit comprises a current source circuit connected to the first and second emitters of said third differential amplifier, and a compensation control circuit connected to said current source circuit and outputting a compensation control voltage to said current source circuit for controlling said weight current based on a voltage of said weight control signal and a reference voltage.

10. A phase shift circuit as claimed in claim 9, wherein said phase shift circuit is operatively connected to a current source and a voltage source, and
wherein said compensation control circuit comprises:
a differential amplifier constituted by first and second transistors, each including a base, an emitter and a collector, and inputting said weight control signal to the base of said first transistor and inputting said reference voltage to the base of said second transistor, the emitters of said first and second transistors are operatively connected to a current source, and the collectors of said first and second transistors respectively outputting first and second output voltages; and
a voltage combining circuit constituted by third and fourth transistors, each including a base, an emitter and a collector, for respectively receiving at the base of said third and fourth transistors the first and second output voltages of said differential amplifier, the collectors of said third and fourth transistors operatively connected to the voltage source, the emitters of said third and fourth transistors are operatively connected to the current source, and for outputting said compensation control voltage.

11. A phase shift circuit as claimed in claim 1, wherein said separating means comprises a phase circuit constituted by variable capacitors and fixed resistors, receiving said input signal and a control voltage and outputting said separated signals; and a comparing circuit receiving said input signal and said separated signal from said phase circuit, comparing said input and separated signals, and outputting the control voltage to said phase circuit to obtain a predetermined amplitude ratio between said input signal and said separated signal.

12. A phase shift circuit as claimed in claim 11, wherein said phase circuit comprises a first circuit having a resistor and a variable capacitor connected in series to said resistor, and a second circuit having a resistor and a variable capacitor connected in series to said resistor, said first circuit and said second circuit being connected in series, said input signal being input to a common connection point of said first circuit and said second circuit, a first of the separated signals being output from said first circuit, and a second of the separated signals being output from said second circuit; and said comparing circuit has a peak detecting circuit for detecting the first separated signal and outputting a peak voltage, a coefficient circuit for inputting said input signal and outputting a $1/\sqrt{2}$ voltage of said input signal, and an error detecting circuit receiving said peak voltage and the $1/\sqrt{2}$ voltage and for outputting said control signal to said variable capacitors of said first and second circuits.

13. A phase shift circuit having a phase shift extent of from 0° to 90° comprising:

a separating unit for separating an input signal into first and second separate signals having a phase difference of 90° therebetween; and a weighting/compounding unit, into which said first and second separated signals and a weight control signal are input, for outputting an output signal having a phase shift extent of from 0° to 90°, based on the weight control signal.

14. A phase shift circuit having a phase shift extent of from 0° to 180° comprising:

a separating unit for separating an input signal into first and second separate signals having a phase difference of 90° therebetween;

a first distributing unit inputting the first separate signal and outputting a first distributed signal and a second distributed signal;

a second distributing unit inputting the second separate signal and outputting a third distributed signal;

a first weighting/compounding unit inputting the first and third distributed signals and outputting a phase signal having a phase shift extent of from 0° to 90°;

a second weighting/compounding unit inputting third and second distributed signals and outputting a phase signal having a phase shift extent of from 90° to 180°; and a third weighting/compounding unit inputting the phase signal having a phase shift extent of from 0° to 90° and the phase signal having a phase shift extent of from 90° to 180°, and outputting a phase signal having a phase shift extent of from 0° to 180°, wherein a weight control signal is input to said first, second and third weighting/compounding units for controlling a weight current.

15. A phase shift circuit having a phase shift extent of from 0° to $(90 \times n)°$ comprising:

a separating unit for inputting an input signal and outputting 0° and 90° separated signals;

a first distributing unit for inputting the 0° separated signal and outputting 0° and 180° distributed signals;

a second distributing unit for inputting the 90° separated signal and outputting a 90° distributed signal;

$(n-1)$ pairs of weighting/compounding units for inputting the 0°, 90°, and 180° distributed signals and outputting phase signals having phase shift extents of from 0° to $90 \times (n-1)°$ and from 90° to $(90 \times n)°$; and an n'th weighting/compounding unit for inputting the phase signals having phase shift extents of from 0° to $90 \times (n-1)°$ and from 90° to $(90 \times n°)$ and outputting a phase signal having a phase shift extent of from 0° to $(90 \times n°)$.

16. A phase shift circuit as claimed in claim 1, wherein said separating unit comprises first, second and third SAW filters, the first SAW filter being used for receiving the input signal, and the second and third SAW filters being used for outputting the first and second separated signals.

17. An automatic phase control circuit comprising:

a discriminating circuit for inputting data and a clock signal and outputting an output data signal;

a phase comparing circuit for comparing the input data with the output data signal and outputting a phase detecting signal;

a reference voltage generating circuit for generating a reference voltage;

a phase difference detecting circuit inputting the phase detecting signal and the reference voltage and outputting a control voltage; and a phase shift circuit inputting the reference voltage as a weight control signal and outputting the clock signal to said discriminating circuit.

18. A phase shift circuit as claimed in claim 1, wherein said separating means comprises a phase circuit constituted by fixed capacitors and variable resistors, receiving said input signal and a control voltage and outputting said separated signals; and a comparing circuit receiving said input signal and said separated signal from said phase circuit, comparing said input and separated signals, and outputting the control voltage to said phase circuit to obtain a predetermined ratio between said input signal and said separated signal.

* * * * *

UNITED STATES PATENT AND TRADEMARK OFFICE
CERTIFICATE OF CORRECTION

PATENT NO. : 4,935,701
DATED : June 19, 1990
INVENTOR(S) : Kawai et al.

It is certified that error appears in the above-identified patent and that said Letters Patent is hereby corrected as shown below:

Col. 1, line 21, change "LCRcircuit" to --LCR-circuit--;

line 43, change "Comprising;" to --comprising--.

Col. 4, line 5, change "20" to --20,--;

Col. 5, line 61, change "$S_{s0}.45°$" to --$S_{s0}$, 45°--; and change "signal" (second occurrence) to --signal,--;

line 62, delete "'";

line 63, change "$S_{s90}$, 45°" to --$S_{s90}$, 45°-- line 64, change "signal'" to --signal,--.

Col. 6, line 2, after "difference" insert --of--.

Col. 7, line 65, change "12" to --12,--.

UNITED STATES PATENT AND TRADEMARK OFFICE
CERTIFICATE OF CORRECTION

PATENT NO. : 4,935,701

DATED : June 19, 1990

INVENTOR(S) : Kawai et al

Page 2 of 3

It is certified that error appears in the above-identified patent and that said Letters Patent is hereby corrected as shown below:

Col. 8, line 2, change "$G_2$" to --$G_2$,--.

line 68, after "voltage" (second occurrence) insert --$V_W$--.

Col. 10, line 43, after "(5)" insert --:--.

Col. 11, line 21 change "Du" to --Du,--.

line 22, change "WCU" to --WCU,--.

line 54, delete "$D_{out1}$ and $D_{out2}$ respectively";

line 55, change "transducers" to --transducers $D_{out1}$ and $D_{out2}$, respectively--.

Col. 12, line 44, delete "other";

line 65, delete "a".

UNITED STATES PATENT AND TRADEMARK OFFICE
CERTIFICATE OF CORRECTION

PATENT NO. : 4,935,701

DATED : June 19, 1990

INVENTOR(S) : Kawai et al

It is certified that error appears in the above-identified patent and that said Letters Patent is hereby corrected as shown below:

Col. 13, line 8 after "phase (first occurrence) insert --distributed--.

Signed and Sealed this

Seventh Day of April, 1992

Attest:

HARRY F. MANBECK, JR.

*Attesting Officer*   *Commissioner of Patents and Trademarks*